United States Patent
Li et al.

(10) Patent No.: US 9,590,604 B1
(45) Date of Patent: Mar. 7, 2017

(54) CURRENT COMPARATOR (71) Applicant: Marvell International Ltd., Hamilton (BM)

(72) Inventors: Xiaoang Li, Sunnyvale, CA (US); Wai Lau, San Jose, CA (US); Yuan Lu, Sunnyvale, CA (US)

(73) Assignee: MARVELL INTERNATIONAL LTD., Hamilton (BM)

( * ) Notice: Subject to any disclaimer, the term of this patent is extended or adjusted under 35 U.S.C. 154(b) by 22 days.

(21) Appl. No.: 14/603,003

(22) Filed: Jan. 22, 2015

Related U.S. Application Data (60) Provisional application No. 61/931,451, filed on Jan. 24, 2014.

(51) Int. Cl.
*H03K 5/22* (2006.01)
*H03K 5/125* (2006.01)

(52) U.S. Cl.
CPC .................................... *H03K 5/125* (2013.01)

(58) Field of Classification Search
CPC ........ H03K 5/2481; H03K 5/249; H03K 5/24; H03K 5/2418; G01R 19/0038
USPC ............................................... 327/63, 94, 96
See application file for complete search history.

(56) References Cited

U.S. PATENT DOCUMENTS

| | | | |
|---|---|---|---|
| 6,307,406 B1 * | 10/2001 | Smith | 327/94 |
| 6,940,318 B1 * | 9/2005 | Wong | H03K 5/08 327/77 |
| 7,541,844 B2 * | 6/2009 | Chiu et al. | 327/70 |
| 2008/0048731 A1 * | 2/2008 | Huang | 327/65 |
| 2009/0085663 A1 * | 4/2009 | Yang | H03D 7/1441 330/260 |
| 2012/0119790 A1 * | 5/2012 | Chen | 327/65 |

* cited by examiner

*Primary Examiner* — Quan Tra (57) ABSTRACT

An apparatus includes a current-to-voltage converter configured to convert first and second currents into first and second input voltages and provide the first and second input voltages to first and second nodes, respectively, and a current difference determination circuit configured to determine a difference between the first and second currents based on a difference between the first and second input voltages. A method includes converting first and second currents into first and second input voltages to output the first and second input voltages to first and second nodes, respectively, and determining a difference between the first and second currents based on a difference between the first and second input voltages.

20 Claims, 5 Drawing Sheets

Coupling a first resistor to a first current source and coupling a second resistor to a second current source during a first time interval

S530

Coupling a first capacitive element and a second capacitive element to a common mode voltage supply during the first time interval

S550

Coupling the first resistor to the second current source and coupling the second resistor to the first current source during a second time interval

S570

Decoupling the first capacitive element and the second capacitive element from the common mode voltage supply during the second time interval

FIG. 5

CURRENT COMPARATOR

CROSS REFERENCE TO RELATED APPLICATION

This present disclosure claims the benefit of U.S. Provisional Application No. 61/931,451 filed on Jan. 24, 2014, which is incorporated by reference herein in its entirety.

BACKGROUND

A current comparator converts currents to voltages using load resistors in order to measure a difference between the currents flowing through the load resistors. When the resistance values of the load resistors are substantially the same, a difference between the converted voltages across the load resistors would be proportional to a difference between the currents flowing through the load resistors. As a result, by measuring the difference between the converted voltages, the difference between the currents can be accurately measured.

However, if a resistor mismatch (i.e., a difference between the resistance values of the load resistors) results from process variations in a fabrication process, a difference between the resistance values may dominate over the difference between the currents in determining the voltages across the load resistors. For example, if the resistance value of a first resistor is sufficiently greater than that of a second resistor, a first voltage across the first resistor may be higher than a second voltage across the second resistor, although a first current flowing through the first resistor is in fact lower than a second current flowing through the second resistor. In this case, the difference between the first and second currents may not be accurately measured by measuring the difference between the first and second voltages.

A conventional approach to address the above issues related to the resistor mismatch includes increasing a size of load resistors. For example, assuming substantially the same process variations in a fabrication process, if a first pair of matched resistors has a length and a width greater than a length and a width of a second pair of matched resistors, respectively, the first pair of matched resistors would have a smaller resistor mismatch than the second pair of matched resistors. However, this approach consumes a greater area for the matched resistors, and also may result in increased power consumption.

SUMMARY

In an embodiment, an apparatus includes a current-to-voltage converter configured to convert first and second currents into first and second input voltages and provide the first and second input voltages to first and second nodes, respectively, and a current difference determination circuit configured to determine a difference between the first and second currents based on a difference between the first and second input voltages.

In an embodiment, the apparatus further includes a pre-amplifier including first and second input terminals coupled to the first and second nodes, respectively, and configured to output first and second amplified voltage signals, and first and second current sources. The current-to-voltage converter includes first and second resistors coupled to a power supply voltage. The current difference determination circuit includes a first pair of switching devices configured to couple the first resistor to the first current source in response to a first version of a switching signal and couple the first resistor to the second current source in response to a second version of the switching signal. The current difference determination circuit also includes a second pair of switching devices configured to couple the second resistor to the second current source in response to the first version of the switching signal and couple the second resistor to the first current source in response to the second version of the switching signal.

In an embodiment, the first pair of switching devices includes first and second switching devices and the first and second switching devices are coupled to the first resistor at a third node. The second pair of switching devices includes third and fourth switching devices and the third and fourth switching devices are coupled to the second resistor at a fourth node.

In an embodiment, the first and fourth switching devices are turned on and the second and third switching devices are turned off when the switching signal has a first value. The first and fourth switching devices are turned off and the second and third switching devices are turned on when the switching signal has a second value.

In an embodiment, the switching signal is a first switching signal and the current-to-voltage converter further includes a first capacitive element coupled to the first and third nodes and a second capacitive element coupled to the second and fourth nodes. The current difference determination circuit further includes a fifth switching element configured to couple the first node to a common mode voltage supply in response to a second switching signal and a sixth switching element configured to couple the second node to the common mode voltage supply in response to the second switching signal.

In an embodiment, the fifth and sixth switching devices are turned on when the second switching signal has a first value and turned off when the second switching signal has a second value.

In an embodiment, the second switching signal has substantially the same period and phase as the first switching signal.

In an embodiment, the apparatus further includes a storage element configured to store the first and second amplified voltage signals and output the stored first and second voltage signals in response to a clock signal.

In an embodiment, the storage element includes first and second sample and hold circuits, the first and second sample and hold circuits configured to store the first and second amplified voltage signals, respectively.

In an embodiment, the difference between the first and second currents has a linear relationship to the difference between the first and second input voltages.

In an embodiment, a method includes converting first and second currents into first and second input voltages to output the first and second input voltages to first and second nodes, respectively, and determining a difference between a difference between the first and second currents based on a difference between the first and second input voltages.

In an embodiment, the method further includes amplifying the first and second input voltages to output first and second amplified voltage signals. A first end of a first resistor and a first end of a second resistor are coupled to a power supply voltage. Determining the difference between the first and second currents includes coupling a second end of the first resistor to a first current source and coupling a second end of the second resistor to a second current source in response to a switching signal during a first time interval, and coupling the second end of the first resistor to the second current source and coupling the second end of the second resistor to the first current source in response to the switching signal during a second time interval.

In an embodiment, a first switching device couples the first resistor to the first current source and a second switching device couples the first resistor to the second current source, and a third switching device couples the second resistor to the first current source and a fourth switching device couples the second resistor to the second current source.

In an embodiment, the first and fourth switching devices are turned on and the second and third switching devices are turned off when the switching signal has a first value. The first and fourth switching devices are turned off and the second and third switching devices are turned on when the switching signal has a second value.

In an embodiment, converting the first and second currents includes applying a first differential voltage at the second end of the first resistor to a first end of a first capacitive element and applying a second differential voltage at the second end of the second resistor to a first end of a second capacitive element. Determining the difference between the first and second currents further includes coupling a second end of the first capacitive element and a second end of the second capacitive element to a common mode voltage supply in response to a second switching signal during the first time interval and decoupling the second end of the first capacitive element and the second end of the second capacitive element from the common mode voltage supply in response to the second switching signal during the second time interval.

In an embodiment, the second end of the first capacitive element and the second end of the second capacitive element are coupled to and decoupled from the common mode voltage supply when the second switching signal has a first value and a second value, respectively.

In an embodiment, the second switching signal has substantially the same period and phase as the first switching signal.

In an embodiment, the method further includes storing the first and second amplified voltage signals and outputting the stored first and second voltage signals in response to a clock signal.

In an embodiment, the first amplified voltage signal is stored in a first sample and hold circuit and the second amplified voltage signal is stored in a second sample and hold circuit.

In an embodiment, the difference between the first and second currents has a linear relationship to the difference between the first and second input voltages.

DETAILED DESCRIPTION

Figure 1:
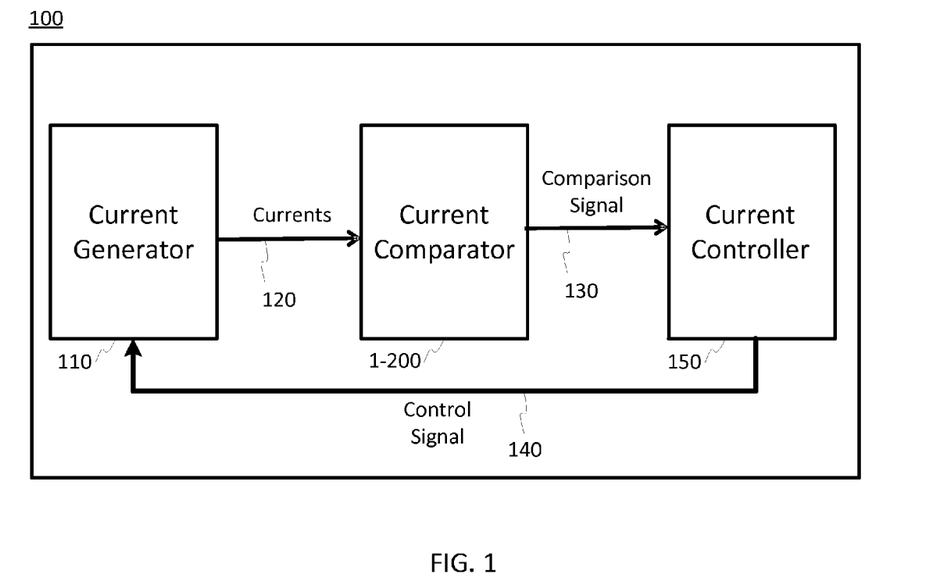
FIG. 1 is a block diagram of a current control system including a current comparator and a current controller.

FIG. 1 is a block diagram of a current control system 100 including a current generator 110, a current comparator 1-200, and a current controller 150. In an embodiment, the current control system 100 is used in a communication device including a zero-intermediate frequency transmitter.

The current comparator 1-200 receives a plurality of currents 120 from the current generator 110, converts the currents 120 into a plurality of voltages, and compares the converted voltages to output a comparison signal 130. In an embodiment, the comparison signal 130 indicates differences between one or more selected pairs of the received currents 120.

The current controller 150 receives the comparison signal 130 and outputs a control signal 140 to the current generator 110 based on the comparison signal 130. In an embodiment, the comparison signal 130 is used to generate a plurality of bias currents having substantially the same magnitude.

The current generator 110 receives the control signal 140 and adjusts one or more values of the plurality of currents 120 based on the control signal 140. In an embodiment, the current generator 110 includes a plurality of current sources.

Figure 2A:
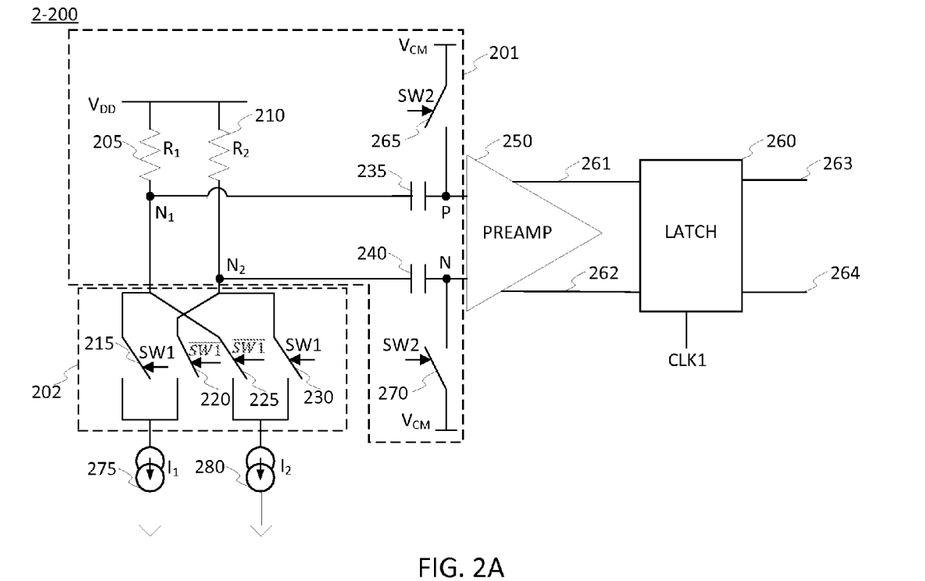
FIG. 2A is a circuit diagram for a current comparator included in the system of FIG. 1 according to an embodiment.

FIG. 2A is a circuit diagram for a current comparator 2-200 included in the current control system 100 of FIG. 1 according to an embodiment. The current comparator 2-220 includes a current-to-voltage converter 201, a current difference determination circuit 202, a preamplifier 250, and a latch 260.

The current-to-voltage converter 201 converts first and second currents $I_1$ and $I_2$ into first and second input voltages $V_p$ and $V_n$ at nodes P and N, respectively, which are coupled to input terminals of the preamplifier 250. The current-to-voltage converter 201 includes first and second resistors 205 and 210, switching devices 265 and 270, first and second current sources 275 and 280, and first and second capacitive elements 235 and 240.

The current difference determination circuit 202 includes switching devices 215, 220, 225, and 230 to determine a current difference between the first and second currents $I_1$ and $I_2$ based on a difference between the first and second input voltages $V_p$ and $V_n$, as will be described below in more detail. In an embodiment, the switching devices 265 and 270 may be considered to be part of the current difference determination circuit 202 although they are explained as being part of the current-to-voltage converter 201 above.

The first resistor 205 is coupled to a power supply voltage $V_{DD}$ and a first node $N_1$. The first node $N_1$ is coupled to first and second switching devices 215 and 225. The first switching device 215 couples and decouples the first resistor 205 and a first current source 275 in response to a first switching signal SW1. The second switching device 225 couples and decouples the first resistor 205 and a second current source 280 in response to an inverted first switching signal $\overline{SW1}$. The inverted first switching signal $\overline{SW1}$ is also referred to herein as a second version of the first switching signal SW1.

The second resistor 210 is coupled to the power supply voltage $V_{DD}$ and a second node $N_2$. The second node $N_2$ is coupled to third and fourth switching devices 220 and 230. The third switching device 220 couples and decouples the second resistor 210 and the first current source 275 in response to the inverted first switching signal $\overline{SW1}$. The fourth switching device 230 couples and decouples the second resistor 210 and the second current source 280 in response to the first switching signal SW1.

A first end of the first capacitive element 235 is coupled to the first node $N_1$ and a second end of the first capacitive element 235 is coupled to the third node P. In an embodiment, capacitance value of the first capacitive element 235 is sufficiently large (e.g., about 10 times of capacitance value of an input capacitance of the preamplifier 250) to reduce gain loss of the preamplifier 250. In an embodiment, the capacitance value of the first capacitive element 235 is sufficiently small to render a voltage settling time at the first node N₁ is shorter than a half of the period of a clock signal (e.g., a clock signal CLK1 to a storage element 260). The third node P is coupled to a first input terminal of the preamplifier 250. The fifth switching device 265 couples and decouples the third node P and a common mode voltage supply $V_{CM}$ in response to a second switching signal SW2. In an embodiment, the second switching signal SW2 has substantially the same period and phase as the first switching signal SW1.

A first end of the second capacitive element 240 is coupled to the second node N₂ and a second end of the second capacitive element 240 is coupled to the fourth node N. The fourth node N is coupled to a second input terminal of the preamplifier 250. The sixth switching device 270 couples and decouples the fourth node N and the common mode voltage supply $V_{CM}$ in response to the second switching signal SW2.

Operation of the current-to-voltage converter 201 is described below in more detail with reference to FIGS. 2B and 3.

Figure 2B:
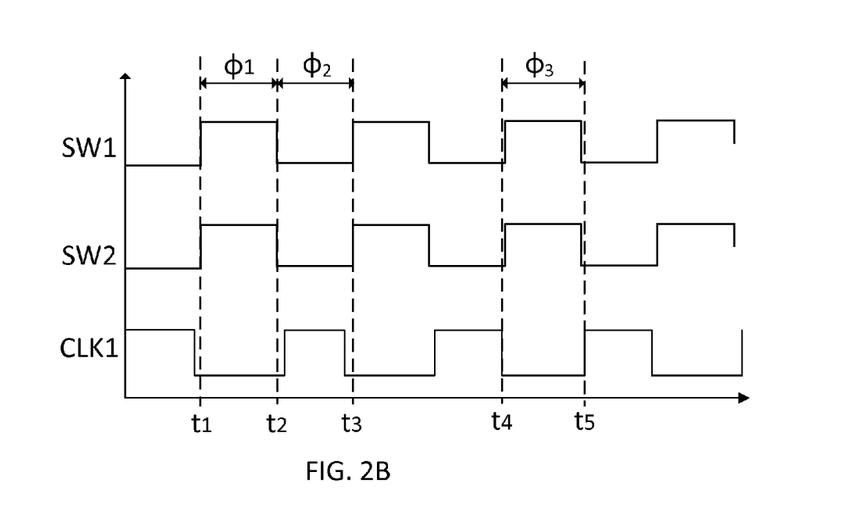
FIG. 2B illustrates waveforms related to an operation of the circuit shown in FIG. 2A according to an embodiment.

Referring to FIG. 2B, during a first time interval $\phi_1$, the first switching signal SW1 has a first value (e.g., a logic high value), and thus the inverted first switching signal $\overline{SW1}$ has a second value (e.g., a logic low value). The first switching device 215 is turned on to couple the first resistor 205 to the first current source 275 while the second switching device 225 is turned off. As a result, the first current I₁ flows through the first resistor 205 and a level of the voltage $V_{N1}$ at the first node N₁ is represented by Equation 1:

$$V_{N1}=V_{DD}-I_1*R_1 \qquad \text{Equation 1.}$$

In Equation 1, $V_{DD}$ is the level of the power supply voltage $V_{DD}$ and R₁ is a first resistance value of the first resistor 205.

During the first time interval $\phi_1$, the second switching signal SW2 also has the first value (e.g., a logic high value), and thus the fifth switching device 265 is turned on to couple the second end of the first capacitive element 235 to the common mode voltage supply $V_{CM}$. As a result, a voltage $V_{C1}$ across the first capacitive element 235 is represented by Equation 2:

$$V_{C1}=V_{N1}-V_{CM}=V_{DD}-I_1*R_1-V_{CM} \qquad \text{Equation 2.}$$

During the first time interval $\phi_1$, since the first switching signal SW1 has the first value (e.g., a logic high value) and the inverted first switching signal $\overline{SW1}$ has the second value (e.g., a logic low value), the fourth switching device 230 is turned on to couple the second resistor 210 to the second current source 280 while the third switching device 220 is turned off. As a result, the second current I₂ flows through the second resistor 210 and a level of the voltage $V_{N2}$ at the second node N₂ is represented by Equation 3:

$$V_{N2}=V_{DD}-I_2*R_2 \qquad \text{Equation 3.}$$

In Equation 3, R₂ is a second resistance value of the second resistor 210.

During the first time interval $\phi_1$, the second switching signal SW2 also has the first value (e.g., a logic high value) during the first time interval $\phi_1$, the sixth switching device 270 is turned on to couple the second end of the second capacitive element 240 to the common mode voltage supply $V_{CM}$. Thus, a voltage $V_{C2}$ across the second capacitive element 240 is represented by Equation 4:

$$V_{C2}=V_{N2}-V_{CM}=V_{DD}-I_2*R_2-V_{CM} \qquad \text{Equation 4.}$$

During a second time interval $\phi_2$, the first switching signal SW1 has a second value (e.g., a logic low value), and thus the inverted first switching signal $\overline{SW1}$ has the first value (e.g., a logic high value). As a result, the second switching device 225 is turned on to couple the first resistor 205 to the second current source 280 while the first switching device 215 is turned off. As a result, the second current I₂ flows through the first resistor 205 and a level of the voltage $V_{N1}$ at the first node N1 is represented by Equation 5:

$$V_{N1}=V_{DD}-I_2*R_1 \qquad \text{Equation 5.}$$

Since the second switching signal SW2 also has the second value (e.g., a logic low value) during the second time interval $\phi_2$, the fifth switching device 265 is turned off to decouple the second end of the first capacitive element 235 and the common mode voltage supply $V_{CM}$. The voltage $V_{C1}$ across the first capacitive element 235 is represented by Equation 6:

$$V_{C1}=V_{N1}-V_P=V_{DD}-I_2*R_1-V_P \qquad \text{Equation 6.}$$

In Equation 6, $V_P$ is a level of a first input voltage at the third node P coupled to the second end of the first capacitive element 235.

Since the charges stored in the first capacitive element 235 remains substantially the same, the voltage $V_{C1}$ across the first capacitive element 235 as represented in Equation 6 has substantially the same level as that during the first time interval $\phi_1$ as represented by Equation 2. Thus, equating Equations 2 and 6, the level of the first input voltage $V_P$ at the third node P is obtained as Equation 7.

$$V_P=I_1*R_1+V_{CM}-I_2*R_1 \qquad \text{Equation 7.}$$

During the second time interval $\phi_2$, the third switching device 220 is turned on to couple the second resistor 210 to the first current source 275 while the fourth switching device 230 is turned off. As a result, the first current I₁ flows through the second resistor 210 and a level of the voltage $V_{N2}$ at the second node N2 is represented by Equation 8:

$$V_{N2}=V_{DD}-I_1*R_2 \qquad \text{Equation 8.}$$

Since the second switching signal SW2 also has the second value (e.g., a logic low value) during the second time interval $\phi_2$, the sixth switching device 270 is turned off to decouple the second end of the second capacitive element 240 and the common mode voltage supply $V_{CM}$. Thus, the voltage $V_{C2}$ across the second capacitive element 240 is represented by Equation 9:

$$V_{C2}=V_{N2}-V_N=V_{DD}-I_1*R_2-V_N \qquad \text{Equation 9.}$$

In Equation 9, $V_N$ is a level of a second input voltage at the fourth node N coupled to the second end of the second capacitive element 240.

Since the charges stored in the second capacitive element 240 remains substantially the same, the voltage $V_{C2}$ across the second capacitive element 240 as represented in Equation 9 has substantially the same level as that during the first time interval $\phi_1$ as represented by Equation 4. Thus, equating Equations 4 and 9, the level of the second input voltage $V_N$ at the fourth node N is obtained as Equation 10:

$$V_N=I_2*R_2+V_{CM}-I_1*R_2 \qquad \text{Equation 10.}$$

Using Equations 7 and 10, a difference between the first and second input voltages $V_P$ and $V_N$ is represented by Equation 11:

$$V_P-V_N=(I_1*R_1+V_{CM}-I_2*R_1)-(I_2*R_2+V_{CM}-I_1*R_2)= \\ (I_1-I_2)*(R_1+R_2) \qquad \text{Equation 11.}$$

According to Equation 11, the difference between the first and second input voltages $V_P$ and $V_N$ bears a linear relationship to a difference between the first and second currents $I_1$ and $I_2$, regardless of the first and second resistance values $R_1$ and $R_2$ of the first and second resistors 205 and 210. Such a linear relationship is maintained when the resistance value $R_1$ of the first resistor 205 is different from the resistance value $R_2$ of the second resistor 210, that is, when a resistor mismatch occurs.

Figure 3:
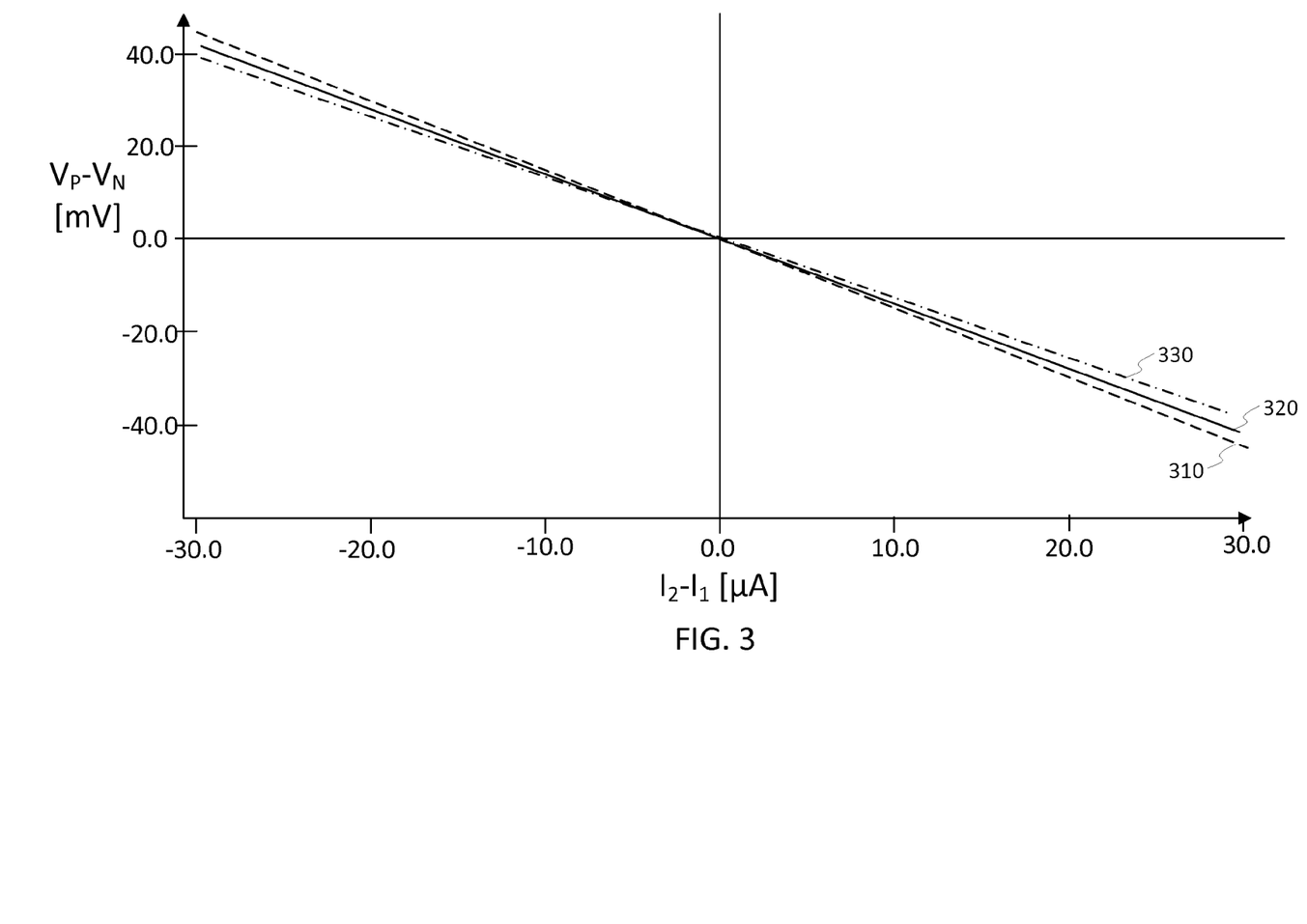
FIG. 3 illustrates an operation of the current-to-voltage converter shown in FIG. 2A according to an embodiment.

FIG. 3 shows a difference (i.e., $V_P$–$V_N$) between the first and second input voltages $V_P$ and $V_N$ as a function of a difference (i.e., $I_2$–$I_1$) between the first and second currents $I_1$ and $I_2$. A dashed line 310, a solid line 320, and a dash-dot line 330 indicate differences between the first and second input voltages $V_P$ and $V_N$ when a difference between the first and second resistance values $R_1$ and $R_2$ correspond to +110Ω, 10Ω, and −110Ω, respectively.

As shown in FIG. 3, the differences between the first and second input voltages $V_P$ and $V_N$ each maintain a linear relationship with the difference between the first and second currents $I_1$ and $I_2$, regardless of a corresponding difference between the first and second resistance values $R_1$ and $R_2$. As long as a linear relationship between a difference between the first and second input voltages $V_P$ and $V_N$ and a difference between the first and second currents $I_1$ and $I_2$ is maintained, the difference between the first and second currents $I_1$ and $I_2$ is unaffected by the resistor mismatch between the first and second resistors 205 and 210, and thus can be measured accurately.

Referring back to FIG. 2A, the first and second input terminals of the preamplifier 250 receives the first and second input voltages $V_P$ and $V_N$, respectively. The preamplifier 250 amplifies the received input voltages $V_P$ and $V_N$ to output first and second amplified voltage signals 261 and 262 to a storage element 260.

The storage element 260 stores values of the first and second amplified voltage signals 261 and 262 to output stored first and second voltage signals 263 and 264 in response to a clock signal CLK1. In an embodiment, the storage element 260 includes a pair of sample and hold circuits, each of which samples the first and second amplified voltage signals 263 and 264 at a time (e.g., a fourth time t4 of FIG. 2B) prior to a time corresponding to rising edges of the first and second switching signals SW1 and SW2 and outputs the sampled voltage signals 263 and 264 during the third time interval $\phi_3$ of FIG. 2B.

Figure 4:
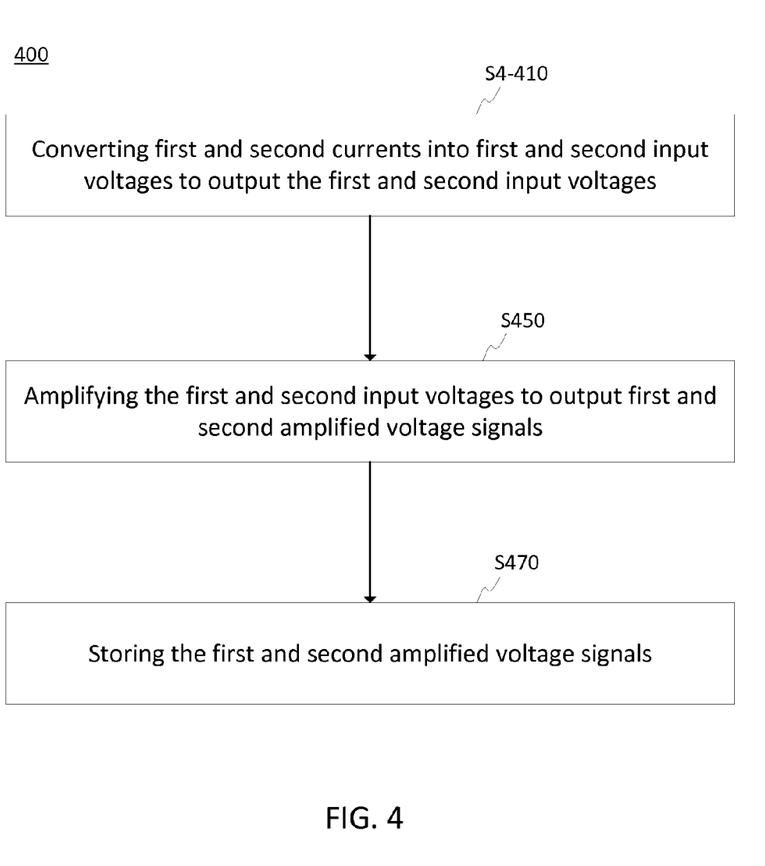
FIG. 4 is a flowchart illustrating a process for measuring a current difference according to an embodiment.

FIG. 4 is a flowchart illustrating a process 400 for measuring a current difference according to an embodiment. The process may be performed by a device such as the current comparator 2-200 of FIG. 2. Although the flowchart shows the process being carried out in a particular order, embodiments are not limited thereto.

At S4-410, first and second currents are converted into first and second input voltages to output the first and second input voltages. In an embodiment, first and second current sources generate the first and second currents, respectively.

At S450, the first and second input voltages are amplified to output first and second amplified voltage signals. In an embodiment, when the first and second input voltages are sufficiently high that amplification of the first and second input voltages is not desirable, the step S450 may be omitted.

At S470, the first and second amplified voltage signals are stored in a storage element. In an embodiment, the storage element includes a pair of sample and hold circuits. The difference between the first and second amplified voltage signals may bear a linear relationship to a difference between the first and second currents. Thus, once such a linear relationship is obtained using various processes including a process based on calibration, the difference between the first and second currents can be determined based on the difference between the first and second amplified voltage signals.

Figure 5:
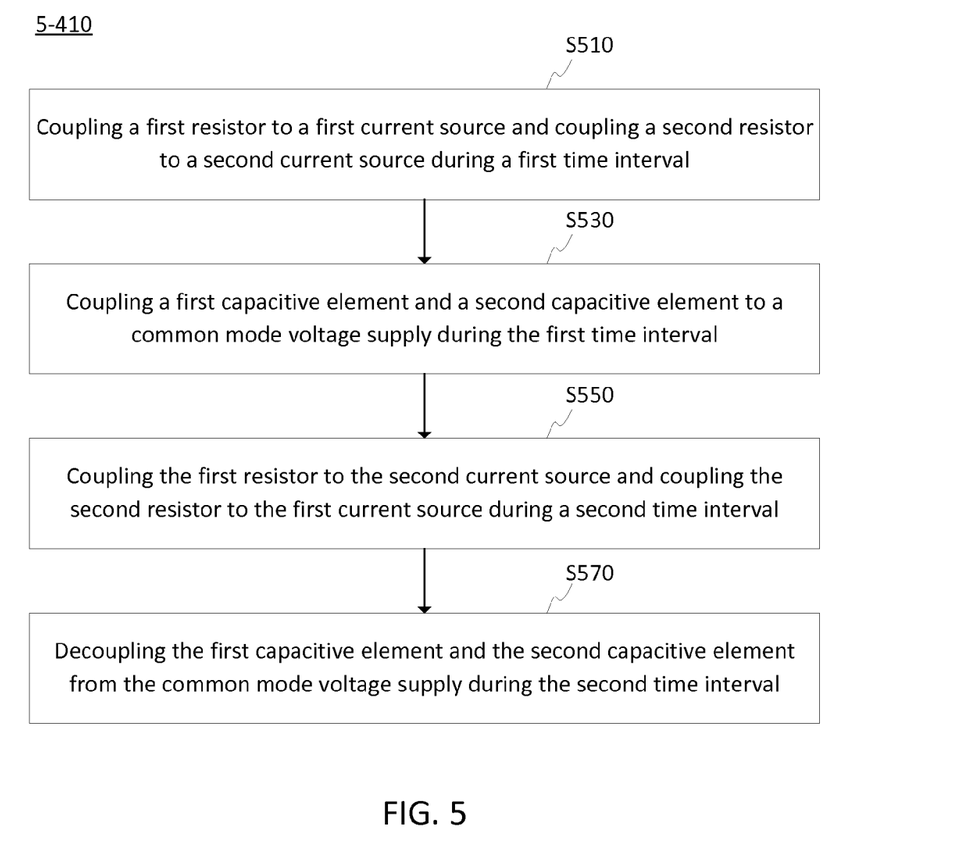
FIG. 5 illustrates a process of converting first and second currents into first and second input voltages according to an embodiment.

FIG. 5 illustrates a process 5-410 of converting first and second currents into first and second input voltages according to an embodiment.

At S510, during a first time interval, a second end of a first resistor is coupled to a first current source and a second end of a second resistor is coupled to a second current source in response to a first switching signal. As a result, a first differential voltage at the second end of the first resistor is applied to a first end of a first capacitive element and a second differential voltage at the second end of the second resistor is applied to a first end of a second capacitive element.

At S530, during the first time interval, a second end of the first capacitive element and a second end of the second capacitive element are coupled to a common mode voltage supply in response to a second switching signal. In an embodiment, voltages across the first capacitive element and the second capacitive element are represented as shown in Equations 2 and 4, respectively.

At S550, during a second time interval, the second end of the first resistor is coupled to the second current source and the second end of the second resistor is coupled to the first current source in response to the first switching signal. As a result, the first differential voltage and the second differential voltage during the second time interval have different levels from those during the first time interval, respectively.

At S570, during the second time interval, the second end of the first capacitive element and the second end of the second capacitive element are decoupled from the common mode voltage supply in response to the second switching signal. In an embodiment, voltages across the first capacitive element and the second capacitive element are represented as shown in Equations 6 and 9, respectively.

According to an embodiment, the voltages across the first capacitive element and the second capacitive element during the first time interval remains substantially the same as those during the second time interval. As a result, a difference between first and second input voltages, which are input to a preamplifier, bears a linear relationship to a difference between the first and second currents, regardless of the resistance values of and of the first and second resistors.

Aspects of the present disclosure have been described in conjunction with the specific embodiments thereof that are proposed as examples. Numerous alternatives, modifications, and variations to the embodiments as set forth herein may be made without departing from the scope of the claims set forth below. Accordingly, embodiments as set forth herein are intended to be illustrative and not limiting.

What is claimed is:

1. An apparatus comprising:
 a current-to-voltage converter configured to respectively convert a first current and a second current into a first input voltage and a second input voltage, and respectively provide the first input voltage and the second input voltage to a first node and a second node, the current-to-voltage converter including:
 a first capacitive element coupled to the first node and a third node; and
 a first switching device configured to (i) couple the first node to a common mode voltage supply when a first switching signal has a first logic value during a first time interval, and (ii) decouple the first node from the common mode voltage supply when the first switching signal has a second logic value during a second time interval;

a current difference determination circuit configured to determine a difference between the first current and the second current based on a difference between the first input voltage and the second input voltage; and a storage element configured to output a first stored voltage signal and a second stored voltage signal when a clock signal has the second logic value during a third time interval, the third time interval being greater than the first time interval, the first stored voltage signal corresponding to the first input voltage, the second stored voltage signal corresponding to the second input voltage.

2. The apparatus of claim 1, further comprising:

a preamplifier including a first input terminal and a second input terminal coupled to the first and second nodes, respectively, and configured to respectively output a first amplified voltage signal and a second amplified voltage signal; and first and second current sources, wherein the current-to-voltage converter further includes a first resistor and a second resistor coupled to a power supply voltage, and wherein the current difference determination circuit includes:

a first pair of switching devices configured to couple the first resistor to the first current source in response to a first version of a second switching signal and couple the first resistor to the second current source in response to a second version of the second switching signal; and a second pair of switching devices configured to couple the second resistor to the second current source in response to the first version of the second switching signal and couple the second resistor to the first current source in response to the second version of the second switching signal.

3. The apparatus of claim 2, wherein the first pair of switching devices includes a second switching device and a third switching device, the second and third switching devices coupled to the first resistor at the third node, the third node being different from the first node, and wherein the second pair of switching devices includes a fourth switching device and a fifth switching device, the fourth and fifth switching devices being coupled to the second resistor at a fourth node.

4. The apparatus of claim 3, wherein the second and fifth switching devices are turned on and the third and fourth switching devices are turned off when the second switching signal has a first value, and wherein the second and fifth switching devices are turned off and the third and fourth switching devices are turned on when the second switching signal has a second value.

5. The apparatus of claim 3, wherein the current-to-voltage converter further includes a second capacitive element coupled to the second and fourth nodes; and a sixth switching device configured to couple the second node to the common mode voltage supply in response to the first switching signal.

6. The apparatus of claim 5, wherein the second switching signal has substantially the same period and phase as the first switching signal.

7. The apparatus of claim 2, wherein the storage element is configured to respectively store the first amplified voltage signal and the second amplified voltage signal as the first stored voltage signal and the second stored voltage signal in response to the clock signal.

8. The apparatus of claim 7, wherein the storage element includes first and second sample and hold circuits, the first and second sample and hold circuits configured to store the first and second amplified voltage signals, respectively.

9. A method comprising:

converting a first current and a second current into a first input voltage and a second input voltage to respectively output the first input voltage and the second input voltage to a first node and a second node, wherein converting the first and second currents includes:

coupling the first node to a common mode voltage supply when a first switching signal has a first logic value during a first time interval; and decoupling the first node from the common mode voltage supply when the first switching signal has a second logic value during a second time interval;

determining a difference between the first current and the second current based on a difference between the first input voltage and the second input voltage, a first capacitive element being coupled to the first node and a third node; and outputting a first stored voltage signal and a second stored voltage signal when a clock signal has the second logic value during a third time interval, the third time interval being greater than the first time interval, the first stored voltage signal corresponding to the first input voltage, the second stored voltage signal corresponding to the second input voltage.

10. The method of claim 9, further comprising:

amplifying the first input voltage and the second input voltage to respectively output a first amplified voltage signal and a second amplified voltage signal, wherein a first end of a first resistor and a first end of a second resistor are coupled to a power supply voltage, and wherein determining the difference between the first and second currents includes:

coupling a second end of the first resistor to a first current source and coupling a second end of the second resistor to a second current source in response to a second switching signal during the first time interval; and coupling the second end of the first resistor to the second current source and coupling the second end of the second resistor to the first current source in response to the switching signal during the second time interval.

11. The method of claim 10, wherein a first switching device couples the first resistor to the first current source and a second switching device couples the first resistor to the second current source, and wherein a third switching device couples the second resistor to the first current source and a fourth switching device couples the second resistor to the second current source.

12. The method of claim 11, wherein the first and fourth switching devices are turned on and the second and third switching devices are turned off when the second switching signal has a first value, and wherein the first and fourth switching devices are turned off and the second and third switching devices are turned on when the second switching signal has a second value.

13. The method of claim 10, wherein converting the first and second currents further includes:
   applying a first differential voltage at the second end of the first resistor to a first end of the first capacitive element; and
   applying a second differential voltage at the second end of the second resistor to a first end of a second capacitive element, and
   wherein determining the difference between the first and second currents further includes:
   coupling a second end of the first capacitive element and a second end of the second capacitive element to the common mode voltage supply in response to the first switching signal during the first time interval; and
   decoupling the second end of the first capacitive element and the second end of the second capacitive element from the common mode voltage supply in response to the first switching signal during the second time interval.

14. The method of claim 10, wherein the second switching signal has substantially the same period and phase as the first switching signal.

15. The method of claim 10, further comprising:
   storing the first amplified voltage signal and the second amplified voltage signal as the first and second stored voltage signals, respectively, in response to the clock signal.

16. The method of claim 15, wherein the first amplified voltage signal is stored in a first sample and hold circuit and the second amplified voltage signal is stored in a second sample and hold circuit.

17. The apparatus of claim 1, further comprising first and second current sources,
   wherein the current-to-voltage converter includes a first resistor and a second resistor, each of the first and second resistors having a first end and a second end, the first end being coupled to a power supply voltage, and
   wherein the current difference determination circuit includes a second switching device, a third switching device, a fourth switching device, and a fifth switching device, the second and third switching devices being coupled to the second end of the first resistor at the third node, the fourth and fifth switching devices being coupled to the second end of the second resistor at a fourth node.

18. The apparatus of claim 17, wherein the first resistor has a first resistance value and the second resistor has a second resistance value, and
   wherein a sum of the first and second resistance values has a linear relationship to the difference between the first and second input voltages.

19. The apparatus of claim 1, wherein the first current and the second current are direct currents, and a first voltage across the first capacitive element during the second time interval has a substantially equal level to a second voltage across the first capacitive element during the first time interval.

20. The apparatus of claim 1, wherein the first logic value is a logic high value and the second logic value is a logic low value.

* * * * *